(12) United States Patent
Segal

(10) Patent No.: US 6,569,270 B2
(45) Date of Patent: *May 27, 2003

(54) PROCESS FOR PRODUCING A METAL ARTICLE

(75) Inventor: Vladimir Segal, Veradale, WA (US)

(73) Assignee: Honeywell International Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 144 days.

(21) Appl. No.: 09/098,761

(22) Filed: Jun. 17, 1998

(65) Prior Publication Data

US 2001/0001401 A1 May 24, 2001

(51) Int. Cl.[7] .................................................. C22F 1/18
(52) U.S. Cl. ........................ 148/670; 148/668; 148/696
(58) Field of Search ................................ 148/668, 669, 148/670, 671, 696

(56) References Cited

U.S. PATENT DOCUMENTS

| | | |
|---|---|---|
| 4,525,417 A | 6/1985 | Dimigen et al. |
| 4,619,695 A | 10/1986 | Oikawa et al. |
| 4,663,120 A | 5/1987 | Parent et al. |
| 4,762,558 A | 8/1988 | German et al. |
| 4,889,745 A | 12/1989 | Sata |
| 5,074,907 A | 12/1991 | Amato et al. |
| 5,087,297 A | 2/1992 | Pouliquen |
| 5,231,306 A | 7/1993 | Meikle et al. |
| 5,282,946 A | 2/1994 | Kinoshita et al. |
| 5,330,701 A | 7/1994 | Shaw et al. |
| 5,400,633 A | 3/1995 | Segal et al. |
| 5,418,071 A | 5/1995 | Satou et al. |
| 5,468,401 A | 11/1995 | Lum et al. |
| 5,508,000 A | 4/1996 | Satou et al. |
| 5,513,512 A | 5/1996 | Segal |

(List continued on next page.)

FOREIGN PATENT DOCUMENTS

| | | |
|---|---|---|
| EP | 590904 | 4/1994 |
| JP | 610107 | 1/1994 |
| JP | 693400 | 4/1994 |
| JP | 6256919 | 9/1994 |
| JP | 06264232 | 9/1994 |
| JP | 08146201 A | 6/1996 |
| JP | 08232061 | 6/1996 |
| JP | 08269701 | 10/1996 |
| JP | 10008244 A | 1/1998 |
| WO | 9201080 | 1/1992 |
| WO | WO 9902743 | 1/1999 |
| WO | WO 9927150 | 6/1999 |
| WO | WO 99/66100 | 12/1999 |
| WO | WO 0129279 | 4/2001 |

OTHER PUBLICATIONS

C. Klein et al., "Manual of Mineralogy", pp. 39–40, 1977.

H–R Wenk, "Preferred Orientation in Deformed metals and Rocks: An Introduction to Modern Texture Analysis", 1985, pp. 8–10.

(List continued on next page.)

*Primary Examiner*—John Sheehan
(74) *Attorney, Agent, or Firm*—Wells St. John P.S.

(57) ABSTRACT

Described is the production of a metal article with fine metallurgical structure and texture by a process that includes forging and rolling and control of the forging and rolling conditions. Also described is a metal article with a minimum of statically crystallized grain size difference in grain size at any location of less than about ±3%, as well as a dispersion in orientation content ratio of textures of less than about ±4% at any location.

13 Claims, 6 Drawing Sheets

U.S. PATENT DOCUMENTS

| | | | |
|---|---|---|---|
| 5,590,389 | A | 12/1996 | Dunlop et al. |
| 5,600,989 | A | 2/1997 | Segal et al. |
| 5,608,911 | A | 3/1997 | Shaw et al. |
| 5,673,581 | A | 10/1997 | Segal |
| 5,693,203 | A | 12/1997 | Ohhashi et al. |
| 5,772,860 | A | 6/1998 | Sawada et al. |
| 5,780,755 | A | 7/1998 | Dunlop et al. ............... 75/249 |
| 5,798,005 | A | 8/1998 | Murata et al. |
| 5,809,393 | A | 9/1998 | Dunlop et al. |
| 5,993,575 | A | 11/1999 | Lo et al. |
| 5,993,621 | A | 11/1999 | Liu |
| 6,024,852 | A | 2/2000 | Tamura et al. |
| 6,085,966 | A | 7/2000 | Shimomuki et al. |
| 6,193,821 | B1 | 2/2001 | Zhang |
| 6,348,113 | B1 | 2/2002 | Michaluk et al. |

OTHER PUBLICATIONS

S. Wright et al. Effect of Annealing Temperature on the Texture of Rolled Tantalum and Tantalum–10 Wt.% Tungsten, reprinted from Tungsten and Refractory Metals 2, 1994, pp. 501–508.

B.D. Cullity, "Structure of Polycrystalline Aggregates", Elements of X–ray Diffraction, 1978, pp. 294–297.

Ferrasse, et al., "Microstructure and Properties of Copper and Aluminum Alloy 3003 Heavily worked by Equal Channel Angular Extrusion", Metallurgical and Materials Transactions. A: Physical Metallurgy & Materials Science, the Minerals, Metals and Materials Society, vol. 28A, no. 4, Apr. 1997, pp. 1047–1057.

V. Pavate, et al., "Correlation between Aluminum alloy sputtering target metallurgical characteristics, Are initialtion, and In–film defect density," SPIE vol. 32147, 1997, pp. 42–47.

Mukai, T. et al., "Dynamic Mechanical Properties of a Near–Nano Aluminum Alloy Processed by Equal–Channel–Angular–Extrusion". Nano–Structured Materials, vol. 10, No. 5, pp. 755–765 (1998) Elsevier Science Ltd.

Hatch, J.E., *ALUMINUM*, 1984, chap. 5, "Metallurgy of Heat Treatment and General Principles of Precipitation Hardening", pp. 134–157, 175–183.

Ferrasse, S. et al., "Development of a Submicrometer-–Grained Microstructure in Aluminum 6061 Using Equal Channel Angular Extrusion", J. Mater. Res. vol. 12, No. 5, May 1997, pp. 1253–1261.

PURE Ti, ANNEALING T-RE
375°C, X200

FIG.6B

PURE Ti, ANNEALING T-RE
675°C, X200

PROCESS FOR PRODUCING A METAL ARTICLE

BACKGROUND

The invention relates to metal articles with fine uniform structures and textures and methods of making such articles. In particular, metal articles of type described are especially useful as sputtering targets.

Sputtering targets of high purity metals and alloys are widely used in electronics and semiconductor industries for sputtering thin films. It is desirable to obtain large size targets.

SUMMARY OF THE INVENTION

In accordance with one embodiment of the invention there is provided a process for producing a metal article, such as a sputtering target, with fine metallurgical structure and texture comprising:

1) providing a metal billet;
2) heating the billet to a forging temperature below the recrystallization temperature of the metal;
3) applying a solid lubricant between the ends of the billet to be forged and press plates of a forging machine in which the billet is to be forged to reduce the friction during forging;
4) forging the billet to a desired billet thickness with about 70% to 90% reduction;
5) bringing the forged billet to about room temperature;
6) rolling the billet to plate with a reduction in thickness per rolling pass sufficient to provide near uniform strain distribution; and
7) recrystalization annealing the plate.

It is also advantageous to machine shallow pockets in both ends of the billet ends prior to applying the solid lubricant of sufficient thickness. Preferably, the billet is forged at a temperature below the minimum temperature of static recrystallization and then rolled and annealed at a time and temperature to provide the beginning stage of static recrystallization.

The rolling reduction per pass is desirably in accordance with a relationship of the minimum reduction per pass, the roll diameter and the desire billet thickness after forging. Generally, the reduction per pass during rolling is about 10% to 20% per pass.

Another embodiment the invention comprises a metal article, such as a sputtering target, having a near-to-minimum of statically crystallized grain size, a difference in grain size at any location of less than about ±3% and a dispersion in orientation content ratio of texture of less than about ±4%.

The present invention can be applied to different metals and alloys that display good ductility and workability at temperatures below corresponding temperatures of static recrystallization. Among metals with which the invention can be applied are Al, Ti, Ta, Cu, Nb, Ni, Mo, Au, Ag, Re, Pt and other metals, as well as their alloys. One embodiment of the method comprises the steps of processing an ingot to a semi-finished billet, including, for example, melting, ingot casting, homogenizing/solutionizing heat treatment, hot working to break down the cast structure, and billet preparation followed by billet shaping and thermomechanical treatment to fabricate a product, for example a sputtering target, and refine the metallurgical structure and produce a desired texture. By one embodiment of the process of the invention, cold/warm working and annealing are used to develop extremely fine, uniform structures and strong, uniform textures that result in improvement in performance of sputtering targets.

DETAILED DESCRIPTION

To optimize thermomechanical treatment, it is desirable to attain intensive and uniform strains before recrystallization annealing. Typically, targets are thin discs fabricated from a single billet processed by rolling or upsetting-forging operations. In both cases, an original billet length (Ho) is reduced to a final thickness (h) and an average strain may be calculated by the formula:

$$\epsilon = (1-h/Ho)\,100\% = [1-(M/Mo)\,]100\% \qquad (1)$$

where Mo=Ho/Do and M=h/d are height-to-diameter ratios of the original billet and the worked product, correspondingly. The final ratio (M) is prescribed by the desired target shape and is usually in the range of from M=0.07 to M=0.3, while the original billet ratio Mo may be in the range of from about 1.0 to 0.5 and yields limits of strain shown in previously described equation (1) as follows:

$$73\% < \epsilon < 89\% \qquad (2)$$

Strain in equation (2) is high enough to optimize static recrystallization only for thin targets. But even for these targets non-uniformity in strain distribution through a billet volume may significantly reduce the amount strain in some areas. Also, demands on capacity of a forging press or rolling mill necessary to provide strains of equation (2) above for large target billets may be too high for some applications. Therefore, there may be restrictions on attainable strains by rolling or forging operations.

Rolling is most suitable for processing to produce thin and large targets. But the original billet ratio (Mo) advantageously should be less than 1, otherwise the end effect during rolling of long cylindrical billets develops very strong nor-uniformity in strain distribution. In addition, to provide near uniform strains even for thin billets, the roll diameter advantageously should be significantly Larger than the billet thickness and the number of reductions per pass can influence the result. Because of the foregoing, rolled billets may have concave-like shapes with maximum strain at contact surfaces and minimum strains at the middle billet section that are not sufficient to optimize recrystallization and develop most useful structures. Recently published Japan Patent No 08-269701 describes a titanium target manufactured by intensive cold rolling of sheet from stock and low temperature annealing. However, this technology cannot be applied to plates and although fine grain size is described for some target parts, the Japanese patent data shows large deviation in grain diameters.

Strain non-uniformity from forging is much stronger than for rolling. Because of contact friction, extensive "dead metal" zones are present at the central billet area. This results in low strains inside these zones and high pressure and load for thin billets. Upsetting bulk targets from a large billet with a large thickness-to-diameter ratio requires very powerful presses and expensive tools but cannot produce products with uniform grain diameters. That is why the forging operation is mostly used for hot breakdown of cast ingots only.

One attempt to overcome these problems is described in Japanese Patent No 08-232061. The patent describes a combination of forging and rolling for titanium targets at temperatures below the temperature of phase transformation. The process uses a temperature below the phase transformation temperature but well above the temperature of static recrystallization for heavy worked materials. As a result, the process cannot optimize recrystallization and develop very tine and uniform structures/textures.

In contrast to the foregoing, the present invention includes:

1) performing the forging step as frictionless upsetting to provide stress-strain uniformity and intensive working without material cracking and press over-loading; and 2) performing the forging step at temperatures below the minimum temperature of static recrystallization for corresponding conditions to provide the finest and most uniform structures/textures. The steps of forging, rolling and annealing can be optimized to provide cost-effective processing and target performance.

Figure 1:
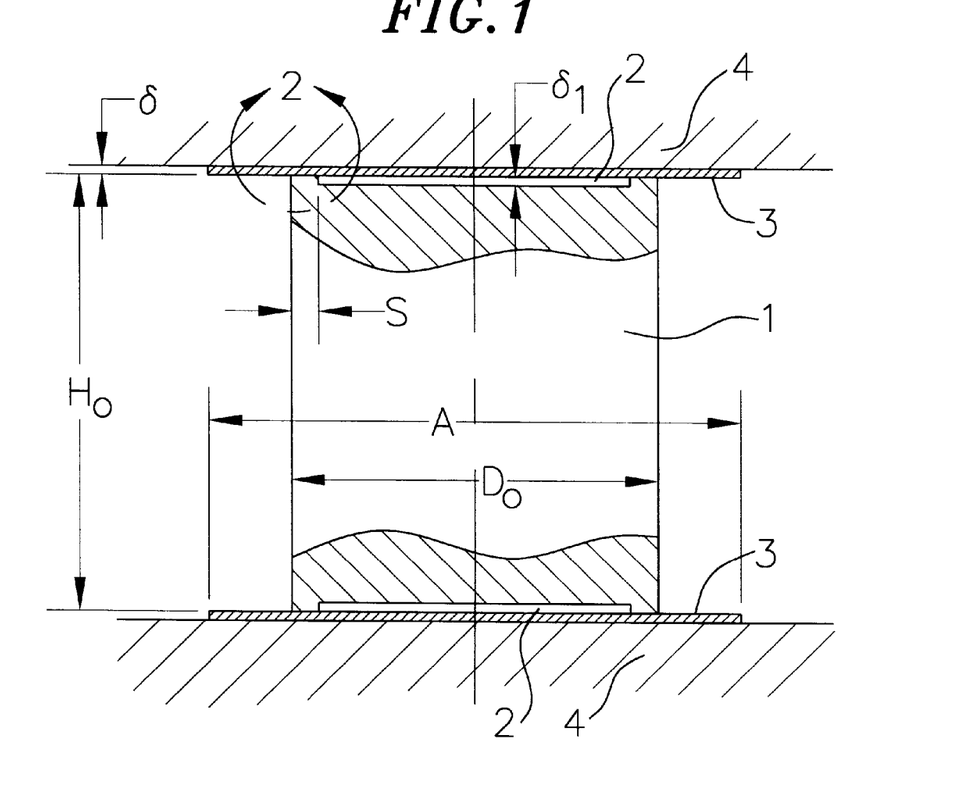
FIG. 1 is a billet-film lubricant assembly at the beginning of upsetting.

Referring to FIG. 1, the original billet (1) has a cylindrical shape and a volume and length-to-diameter ratio Mo. Two shallow pockets (2) are fabricated at the billet ends before upsetting. Cold upsetting is preferable, but in some cases preheating of the billet and tool to a temperature below the temperature of static recrystallization may be used to reduce working pressure arid load. Two thin sheets of solid lubricant (3) are placed between the billet end and forging plate (4) mounted in a press. It has been found that best results are obtained with lubricant polymers that exhibit visco-elastic behavior at working conditions, such as polyethylene, polytetrafluroethylene or polyurethane.

Figure 2:
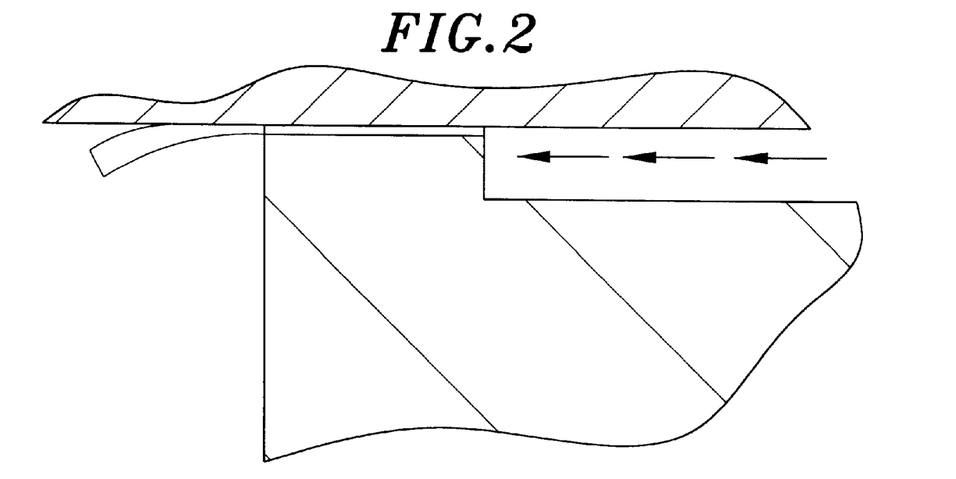
FIG. 2 shows a sectional view "C" of FIG. 1 during upsetting.

As can be seen in FIGS. 1 and 2, depending on the billet diameter Do, film thickness ($\delta$) is varied from about 0.5 mm to 2.5 mm while film size (A) should exceed Do. Pocket (depth ($\delta o$) is advantageously slightly less than film thickness ($\delta$) and pocket borders (5) have a width "S" from about 5 mm to 20 mm.

In accordance with the present invention, visco-elastic polymer film is used to entirely separate the billet and tool. During upsetting, the polymer fills the pockets and flows into contact with the billet. Some excess of polymer flows out from the pockets (FIG. 2) and provides low positive friction in the flow direction along billet ends, thus eliminating "dead metal" zones and improving billet stability. It has been found that with the invention the original billet ratio (Mo) may be as large as Mo=1.5, and the polymer lubricant film enables partial reductions of up to $\epsilon \sim 75\%$. Because of increase of the original billet ratio Mo to 1.5, the limits for attainable strain (see equation (1) are much better than (2)

$$87\% < \epsilon < 92\% \qquad (3)$$

that in conjunction with uniform strain distribution allows one to optimize recrystallization in most cases. Also, thin billet after forging (up to M=0.16) provides the best conditions for following rolling.

Figure 3:
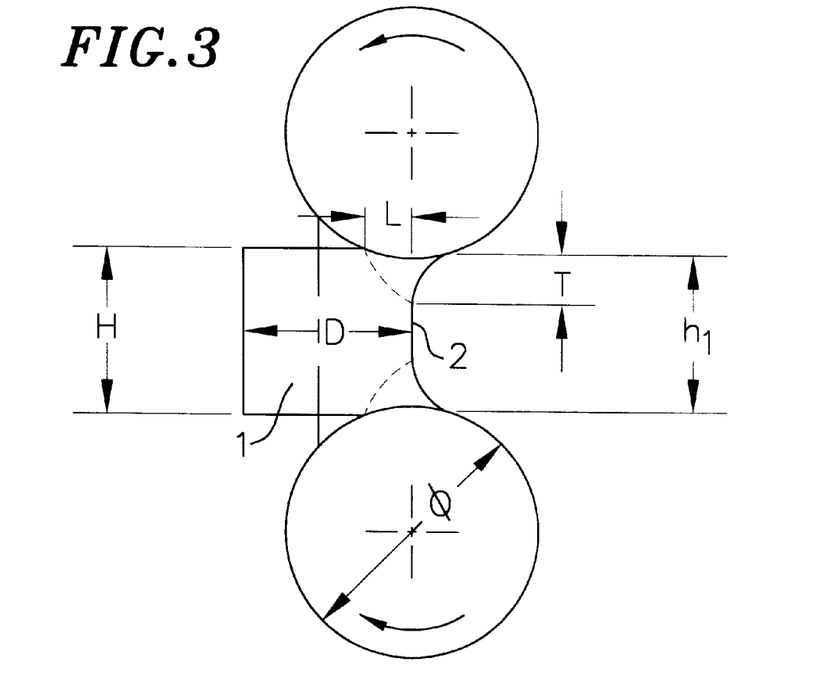
FIG. 3 shows the beginning of rolling for long cylindrical billets.
Figure 4:
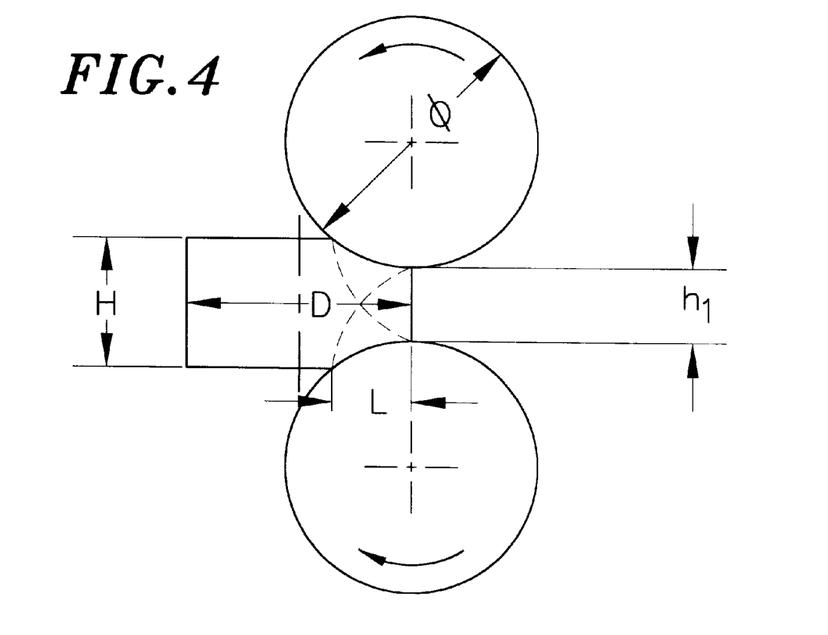
FIG. 4 shows the beginning of rolling for short cylindrical billets.

The preliminary forged billet is rolled for further reduction of thickness. Cold or warm rolling may be used. Rolling may be performed in two or four mutually perpendicular directions to produce a product with a circle-like shape. It is important to provide the most uniform strain distribution during rolling by controlling roll diameter-to-billet thickness ratios ($\phi/H$), billet thickness-to-diameter ratio (M) and reductions per pass. An important aspect is to prevent buckling along the free surface (2) of a cylindrical billet (1) at the beginning of rolling (FIG. 3). It has been found that buckling area (T) is approximately equal to a billet-roll contact length (L), and buckling is eliminated if contact length exceeds a billet thickness ($h_1$) after the first pass (FIG. 4). In other words, if L>H, then $$\phi/H \geq \frac{4(1-\varepsilon)^2 + \varepsilon^2}{2\varepsilon} \qquad (4)$$

where $\phi$ is the roll diameter, $\epsilon = (1-h/H)\ 100\%$ is rolling reduction per pass. Calculations with formula (4) for different reductions are shown in Table 1.

TABLE 1

| $\epsilon$ | 5% | 10% | 15% | 20% | 25% |
|---|---|---|---|---|---|
| $\phi/H$ | 36 | 16 | 9.7 | 6.5 | 4.6 |

As can be seen, at an average reduction of 15% or less, the roll diameter should be at least about 10 times (9.7 in Table 1) as large as the cylindrical billet thickness. On the other hand, use of thin billets for rolling without upsetting reduces possible reductions (1). Conventional target rolling suffer from both disadvantages, that is, non-uniform and low reductions are equally unacceptable to optimize structure. In the present invention high ratios of roll diameter-to-billet thickness ($\phi/H$) are provided by preliminary billet upsetting to the necessary thickness (H). Simultaneously the upsetting operation provides a pre-rolling billet ratio (m) of less than about 0.3 that is useful to attain uniform rolling reductions along a billet. Partial rolling reductions from about 10% to 20% per pass are also useful for near uniform strain distribution in the final product. Rolling reductions lower than about 10% develop higher strains at billet surfaces white reduction more than about 18% develop higher strains at billet middle section. All these parameters define the best embodiments for performing upsetting and rolling for targets for optimum results.

The last step in target processing is recrystallization annealing. For many metals and alloys, strains from equation (3) are enough to optimize static recrystallization. To attain this goal, first the lowest temperature necessary to start static recrystallization, and then the shortest time necessary to complete that at all billet volume should be determined. Corresponding structures have the minimum grain sizes and the lowest dispersions of grain diameters inside each local area. As the present method also provides uniform strains at any part of the billet, the minimum temperature of static recrystallization may be realized as the optimal temperature for the whole billet at the shortest time. This results in very fine and uniform structures and strong, uniform texture for the target produced.

Another embodiment of the invention is preforming forging in a few steps with successive decrease a billet thickness and resumption of film lubricant at each step. That way forging may be prolonged to low billet thickness without distortion of frictionless conditions and strain uniformity under relative low pressure and load. If forging is continued to the final target thickness without rolling, corresponding forging textures are provided for targets. Similarly, in the special cases rolling may be performed without forging with near uniform strain distribution in accordance with the invention.

The following example illustrates one embodiment of the invention.

High purity titanium was cast into an ingot of 300 mm diameter and hot worked by swaging at a temperature of 800 C to a rod diameter of 130 mm. Billets of 162 mm length were then cut from the 130 mm rod. Pockets of 120 mm diameter and 1 mm thickness were machined at billet ends. Billets were upset at a temperature of 350° C. to a thickness of 54 mm.

Teflon films of 150×150 mm2 and thickness of 1.2 mm were used as lubricants for frictionless upsetting. Thereafter cold rolling with a roll diameter of 915 mm was performed in eight passes with partial reductions of 12% per pass along four directions under an angle of 45°.

Figure 6A:
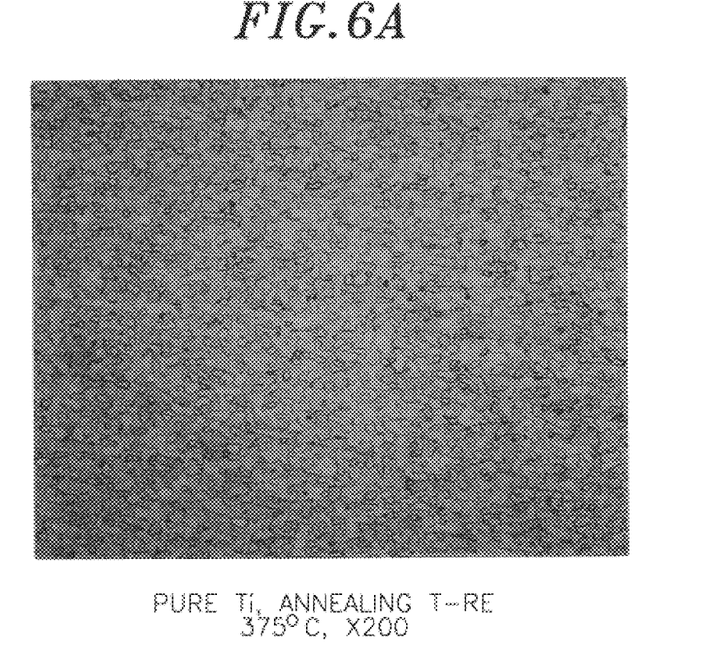
FIG. 6A is the microstructure of pure Ti after frictionless forging/rolling and annealing at 375° C., 2 hours (×200 magnification)
Figure 6B:
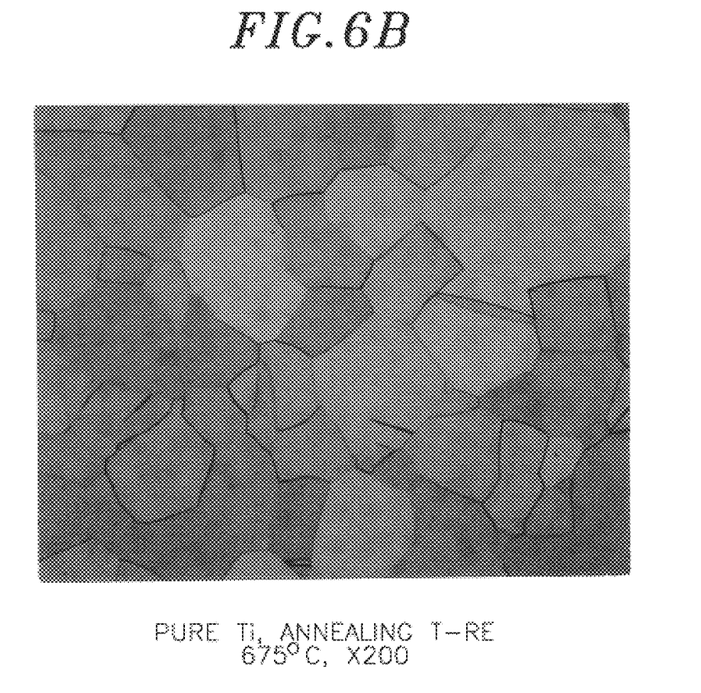
FIG. 6B is the microstructure of pure Ti after frictionless forging/rolling and annealing at 675° C., 2 hours (×200 magnification)

Coupons across the thickness of the rolled billet were cut from central, mid-radius and external areas and annealed at different temperatures during 2 hours (h). Two planes of coupons, one year the surface and the second near the middle section, were investigated for structure and texture and photomicrographs thereof are shown in FIGS. 6A and 6B.

In another example, tantalum sputtering targets were made by the process described above. The composition of the resulting tantalum target is shown in Table 2, the target comprising 99.95% tantalum and balance as shown in the table.

TABLE 2

| ELEMENT | TYPICAL | ELEMENT | TYPICAL |
| --- | --- | --- | --- |
| C | 10 | Ca | <5 |
| O | 15 | Fe | 15 |
| N | 15 | Mg | <5 |
| H | <5 | Mn | 40 |
| K | 0.001 | Mo | 40 |
| Li | 0.001 | Nb | 150 |
| Na | 0.00 | Ni | <5 |
| Al | <5 | Si | 15 |
| B | 2 | Sn | <5 |
| Cu | <5 | Ti | 5 |
| Co | <5 | W | 25 |
| Cr | <5 | Zr | <5 |

Reported in ppm.
C, O, N and H by LECO analysis.
Na, Li and K by SIMS analysis

Metallic elements by ICP (inductively Coupled Plasma).

Figure 5:
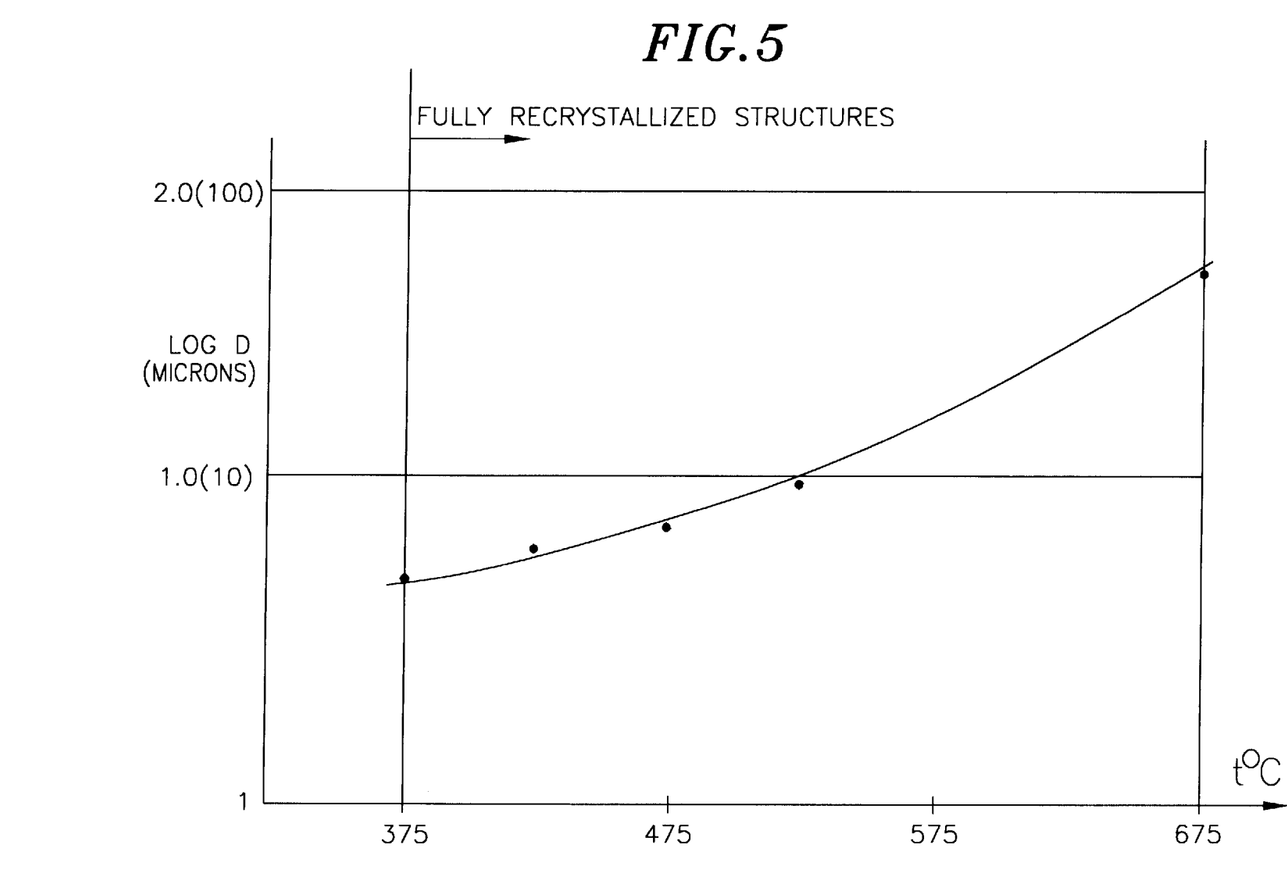
FIG. 5 is a graph relating grain size and temperature for recrystallized structures showing effect of recrystallization annealing on grain size of pure Ti alloy after frictionless forging/rolling.
Figure 7A:
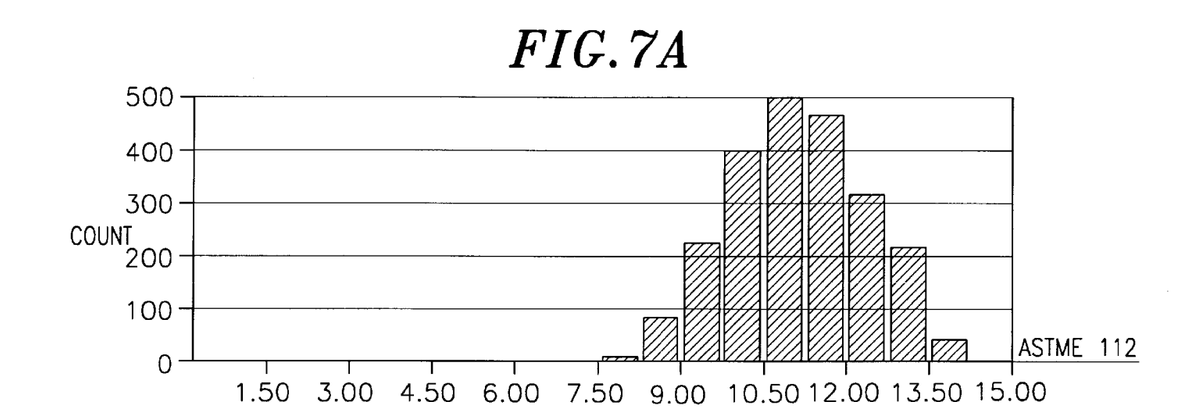
FIG. 7A shows the dispersion in grain size of pure Ti after frictionless forging/rolling and annealing at 375° C., 2 hours.
Figure 7B:
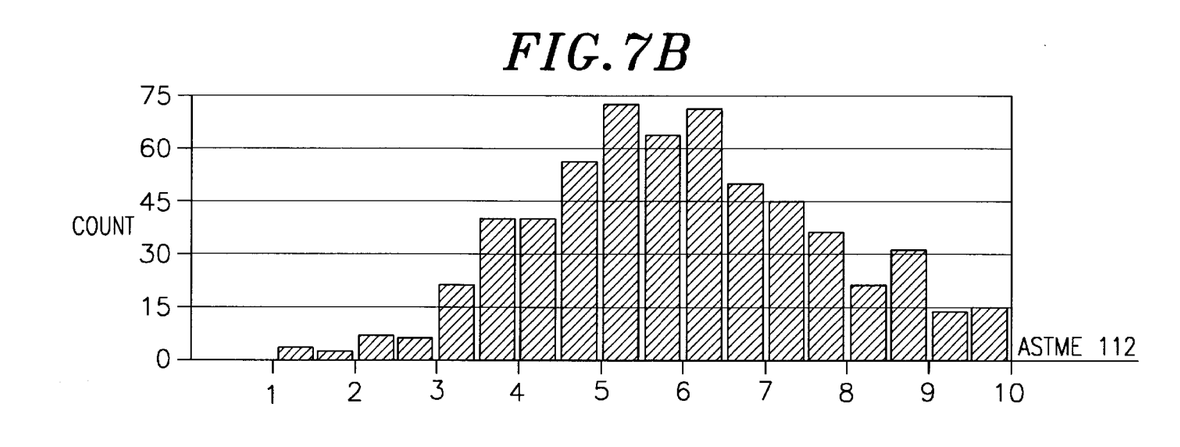
FIG. 7B shows the dispersion in grain size of pure Ti after frictionless forging/rolling and annealing at 675° C., 2 hours.
Figure 8:
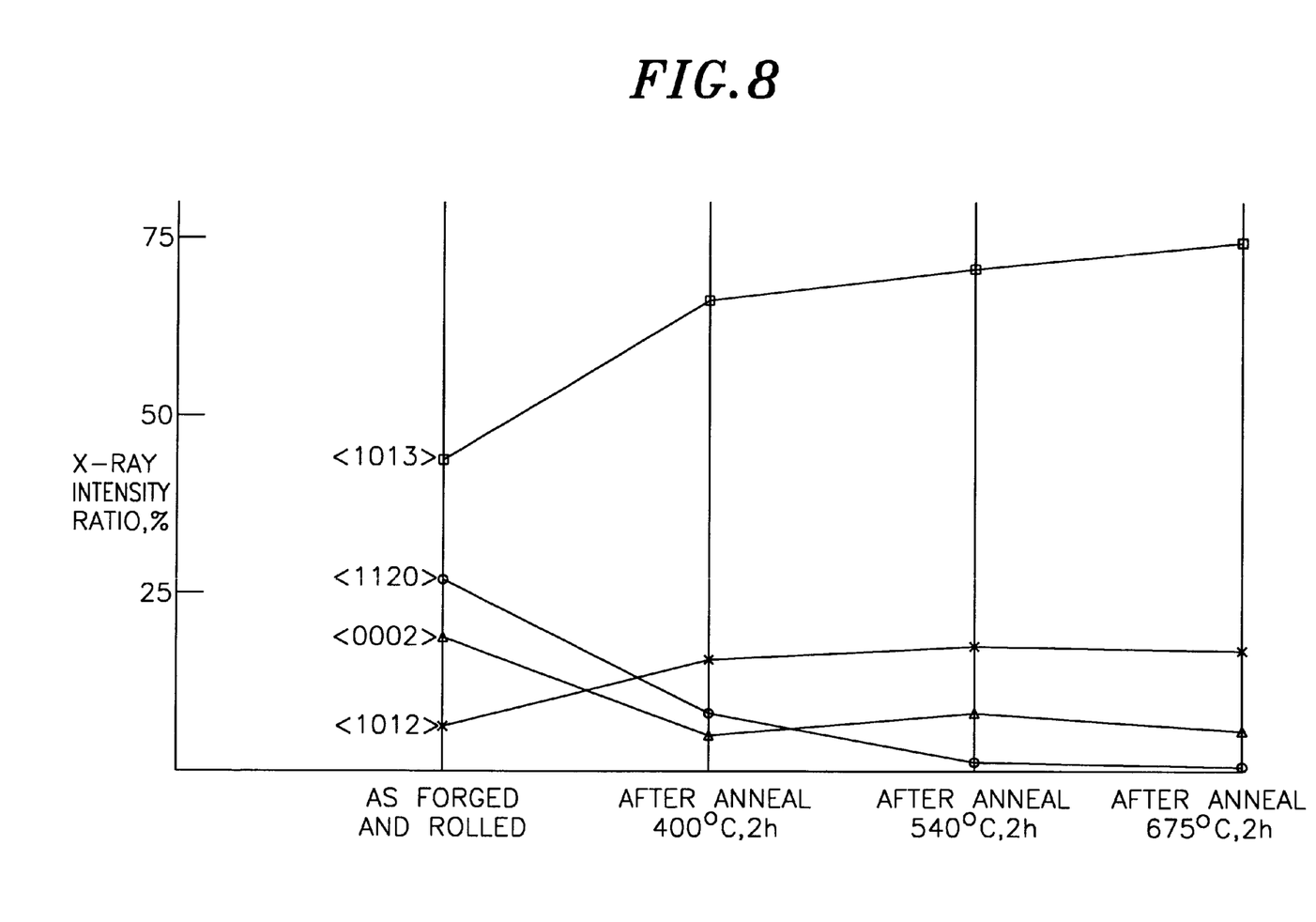
FIG. 8 shows the effect of annealing temperature on texture (x-ray intensity ratios) of pure titanium after frictionless forging/rolling processing.

FIG. 5 shows effect of annealing temperature on average grain size of titanium. The lowest temperature of static recrystallization is about 375° C. Corresponding very fine structure of average grain sizes of 6 micrometers demonstrates also low local dispersion of grain diameter and strong texture (1013) (FIG. 8) with orientation content ratio of 65% in the perpendicular direction to target surface. An increase of annealing temperature results in intensive grain growth and larger dispersion in grain size with only moderate strengthening of texture. The photomicrographs shown in FIGS. 6A and 6B show structures of pure Ti after frictionless forging/rolling and annealing at 375° C. for 2 hours and annealing at 675° C. for 2 hours, respectively. Analysis of structures and textures for different coupons did not detect a noticeable distinction at any target point. Dispersion in the average grain size at different target locations was less than about ±3% and dispersion in the orientation content ratio of textures was less than ±4% which, probably, corresponds to the accuracy of measurement methods. FIGS. 7A and 7B depict graphically the dispersion of grain size of pure Ti for the structures shown in FIGS. 6A and 6B, respectively.

An important advantage of the invention is the production of very fine and uniform structures and strong uniform textures at any point of a target which formerly could not be attainable. The method provides targets with significant improvement in sputtering target performance.

The following illustrate the features of one embodiment of the invention:

1) working a billet during thermomechanical processing by combining the frictionless upset forging and rolling;

2) frictionless forging during upsetting operation that develops positive friction along contact surfaces and increases process stability;

3) predetermine parameters of upsetting operation to increase accumulated strains, reduce press capacity and enable effective rolling;

4) predetermine parameters of rolling conditions to enable near uniform strain distribution and cylindrical shape (for sputtering targets) of the product;

5) using as the annealing temperature the lowest temperature of static recrystallization; and 6) producing a sputtering target with very fine and uniform structures and uniform strong textures not previously attainable.

What is claimed is:

1. A process for producing a metal article, with fine metallurgical structure and texture comprising:
   providing a metal billet;
   heating the billet to a forging temperature below the recrystallization temperature of the metal;
   applying a solid lubricant between press plates of a forging machine in which the billet is to be forged and the ends of the billet to be forged to reduce the friction during forging;
   forging the billet to a desired billet thickness with about 70% to 90% reduction;
   bringing the forged billet to about room temperature;
   rolling the billet with a reduction in thickness per rolling pass sufficient to provide near uniform strain distribution to produce a plate; and
   recrystallization annealing the plate.

2. A process according to claim 1 wherein the billet is forged at a temperature below the minimum temperature of static recrystallization.

3. A process according to, claim 1 wherein the billet is annealed at a time and temperature to provide the beginning stage of static recrystallization.

4. A process according to claim 1 wherein the solid lubricant comprises a film of a polymer that exhibits viscoelastic behavior at forging conditions.

5. A process according to claim 4 wherein the solid lubricant comprises polyethylene, polyurethane or polytetrafluroethylene.

6. A process according to claim 1 wherein shallow pockets are machined at both billet ends prior to applying the solid lubricant.

7. A process according to claim 6 wherein the thickness of the solid lubricant applied to opposite ends of the billet prior to forging is slightly greater than the pocket depth.

8. A process according to claim 1 wherein the rolling reduction per pass is in accordance with the following relationship:

$$\phi/H \geq \frac{4(1-\varepsilon)^2 + \varepsilon^2}{2\varepsilon} \quad (4)$$

where $\varepsilon$ is the approximate minimum reduction per pass, $\phi$ is the roll diameter and H as the desired billet thickness after forging.

9. A process according to claim 1 wherein the billet is rolled to reduction of about 10% to 2% per pass.

10. A process according to claim 1 wherein the billet is forged in two or more forging steps with successive decrease in billet thickness and after applying solid lubricant before each forging step.

11. A process according to claim 1 wherein the metal billet comprises titanium.

12. A process according to claim 1 wherein said metal article comprises a sputtering target.

13. A process according to claim 1 wherein the forgoing the billet comprises about 70% to 80% reduction.

* * * * *

UNITED STATES PATENT AND TRADEMARK OFFICE
CERTIFICATE OF CORRECTION

PATENT NO. : 6,569,270 B2
APPLICATION NO. : 09/098761
DATED : May 27, 2003
INVENTOR(S) : Vladimir Segal It is certified that error appears in the above-identified patent and that said Letters Patent is hereby corrected as shown below:

Title Page, References Cited, U.S. PATENT DOCUMENTS, please insert:
--4,842,706    6/1989  Fukasawa-- before "4,889,745".
--4,960,163    10/1990 Fang et al.-- before "5,074,907".

Title Page, FOREIGN PATENT DOCUMENTS, please insert:
--WO 0031310 11/1999-- before "WO 0129279".
--WO 8707650  6/1987-- before "WO 9902743".

Column 1, before the "BACKGROUND" section, please insert:
--RELATED PATENT DATA
This patent claims the benefit of U.S. Provisional Application Serial No. 60/052,218 filed on July 11, 1997.--

Column 1, line 35
Replace "recrystalization annealing the plate."
With --recrystallization annealing the plate."--

Column 1, line 48
Replace "Another embodiment the invention comprises a metal"
With --Another embodiment of the invention comprises a metal.--

Column 2, line 46
Replace "$\varepsilon=(1-h/Ho)\ 100\%=[1-(m/Mo)\ ]100\%$"
With --$\varepsilon=(1-h/Ho)\ 100\%=[1-(m/Mo)^{2/3}]100\%$--

Column 3, line 5
Replace "diameter advantageously should be significantly Larger than"
With --diameter advantageously should be significantly larger than--

Column 3, line 36
Replace "develop very tine and uniform structures/textures."
With --develop very fine and uniform structures/textures.--

Column 3, line 54
Replace "working pressure arid load."
With --working pressure and load.--

Column 5, line 41
Replace "coupons, one year the surface and the second near the"
With --coupons, one near the surface and the second near the--

UNITED STATES PATENT AND TRADEMARK OFFICE
CERTIFICATE OF CORRECTION

PATENT NO. : 6,569,270 B2
APPLICATION NO. : 09/098761
DATED : May 27, 2003
INVENTOR(S) : Vladimir Segal It is certified that error appears in the above-identified patent and that said Letters Patent is hereby corrected as shown below:

Column 5, Table 2, line 58
Replace "0.00"
With --0.001--

Column 8, claim 8, line 2
Replace "is the roll diameter and H as the desired billet thickness after"
With --is the roll diameter and H is the desired billet thickness after--

Column 8, claim 9, line 5
Replace "rolled to reduction of about 10% to 2% per pass."
With --rolled to reduction of about 10% to 20% per pass.--

Column 4, line 61
Replace "about 10% develop higher strains at billet surfaces white"
With --about 10% develop high strains at billet surfaces while--

Signed and Sealed this

Twenty-second Day of May, 2007

JON W. DUDAS
*Director of the United States Patent and Trademark Office*